(12) United States Patent
Andres Cuenca et al.

(10) Patent No.: US 11,025,177 B2
(45) Date of Patent: Jun. 1, 2021

(54) PIEZOELECTRIC GENERATOR SYSTEM AND ELECTRICAL SYSTEM INCLUDING SUCH PIEZOELECTRIC GENERATOR SYSTEM

(71) Applicants: Francisco Jose Andres Cuenca, Badalona (ES); Elsa Gonzalez Munoz, Badalona (ES)

(72) Inventors: Francisco Jose Andres Cuenca, Badalona (ES); Elsa Gonzalez Munoz, Badalona (ES)

( * ) Notice: Subject to any disclaimer, the term of this patent is extended or adjusted under 35 U.S.C. 154(b) by 467 days.

(21) Appl. No.: 15/776,030

(22) PCT Filed: Jun. 27, 2016

(86) PCT No.: PCT/EP2016/064786
§ 371 (c)(1),
(2) Date: May 14, 2018

(87) PCT Pub. No.: WO2017/092883
PCT Pub. Date: Jun. 8, 2017

(65) Prior Publication Data
US 2018/0337616 A1 Nov. 22, 2018

(30) Foreign Application Priority Data
Dec. 2, 2015 (EP) .................... 15382601

(51) Int. Cl.
*H02N 2/18* (2006.01)
*H01L 41/113* (2006.01)
(52) U.S. Cl.
CPC .......... *H02N 2/181* (2013.01); *H01L 41/113* (2013.01); *H02N 2/18* (2013.01)
(58) Field of Classification Search
CPC ............... H01L 41/113; H01L 41/1132; H01L 41/1134; H01L 41/1136; H01L 41/1138
(Continued)

(56) References Cited

U.S. PATENT DOCUMENTS 3,559,027 A    1/1971   Arsem
5,570,286 A    10/1996   Margolis et al.
(Continued)

FOREIGN PATENT DOCUMENTS

| EP | 2398660 A1 | 12/2011 |
|---|---|---|
| WO | WO 2010/094312 A1 | 8/2010 |
| WO | WO 2010/149149 A3 | 12/2010 |

OTHER PUBLICATIONS

International Search Report and Written Opinion dated Aug. 9, 2016 for PCT/EP2016/064786, 10 pages.

*Primary Examiner* — Derek J Rosenau
(74) *Attorney, Agent, or Firm* — Squire Patton Boggs (US) LLP

(57) ABSTRACT

The piezoelectric generator system (100) comprises at least one piezoelectric generator unit (650) comprising an array (400) of piezoelectric modules ($M_{ji,i}$) each including a piezoelectric element ($E_{ji,i}$) and a AC/DC converter ($C_{ji,i}$). The piezoelectric modules ($M_{ji,i}$) in the array (400) are connected to each other in series and they are each arranged in sets (i) connected to each other in parallel. When dynamic loads ($F_1, F_2 \ldots F_n$) act on the piezoelectric generator units (650), said loads ($F_1, F_2 \ldots F_n$) are adjusted such that a predetermined amount of force (F) is applied with a predetermined speed to the piezoelectric modules ($M_{ji,i}$), such that the array (400) supplies high electric power ($P_{out-tot}$) to one or more batteries (250) in, for example, an electric vehicle (1000), with each battery (250) being capable of working in at least storage, standby and supply conditions according to the corresponding electric power level thereof.

16 Claims, 8 Drawing Sheets

(58) Field of Classification Search
USPC .......................................................... 310/339
See application file for complete search history.

(56) References Cited

U.S. PATENT DOCUMENTS

| | | |
|---|---|---|
| 5,804,948 A | 9/1998 | Foust |
| 6,952,060 B2 | 10/2005 | Goldner et al. |
| 7,087,342 B2 | 8/2006 | Song et al. |
| 7,250,697 B2 | 7/2007 | Beaulieu |
| 7,602,140 B2 | 10/2009 | Asaumi et al. |
| 7,936,113 B2 | 5/2011 | Namuduri et al. |
| 8,143,766 B2 | 3/2012 | Namuduri et al. |
| 8,874,291 B2 | 10/2014 | Gresser |
| 2003/0034697 A1 | 2/2003 | Goldner et al. |
| 2004/0078662 A1* | 4/2004 | Hamel ................ B60C 23/0411 714/22 |
| 2004/0206559 A1 | 10/2004 | Song et al. |
| 2005/0099160 A1 | 5/2005 | Asaumi et al. |
| 2005/0258717 A1 | 11/2005 | Mullen |
| 2006/0125325 A1 | 6/2006 | Beaulieu |
| 2010/0219720 A1* | 9/2010 | Namuduri ................ F16F 1/18 310/319 |
| 2010/0219721 A1 | 9/2010 | Namuduri et al. |
| 2012/0119624 A1* | 5/2012 | Vamvas ................... H02N 2/18 310/339 |
| 2012/0133334 A1 | 5/2012 | Lachenmeier et al. |
| 2012/0286625 A1 | 11/2012 | Cherian |
| 2012/0303193 A1 | 11/2012 | Gresser |

* cited by examiner

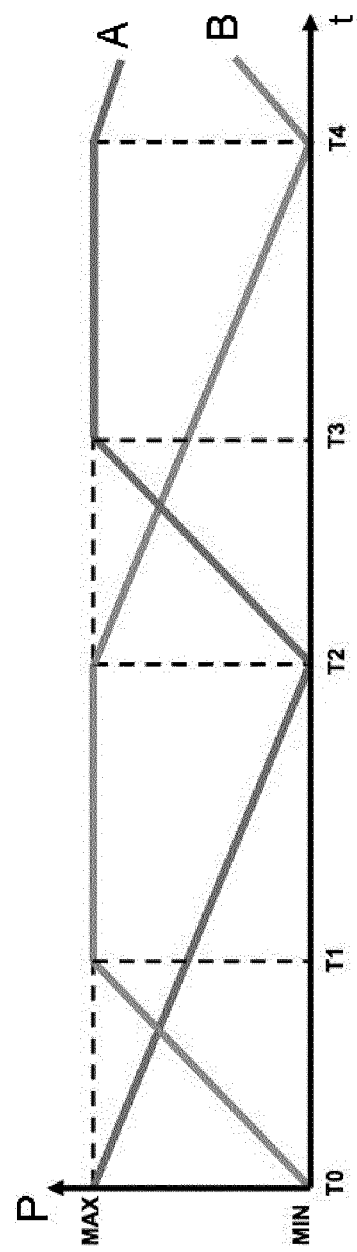

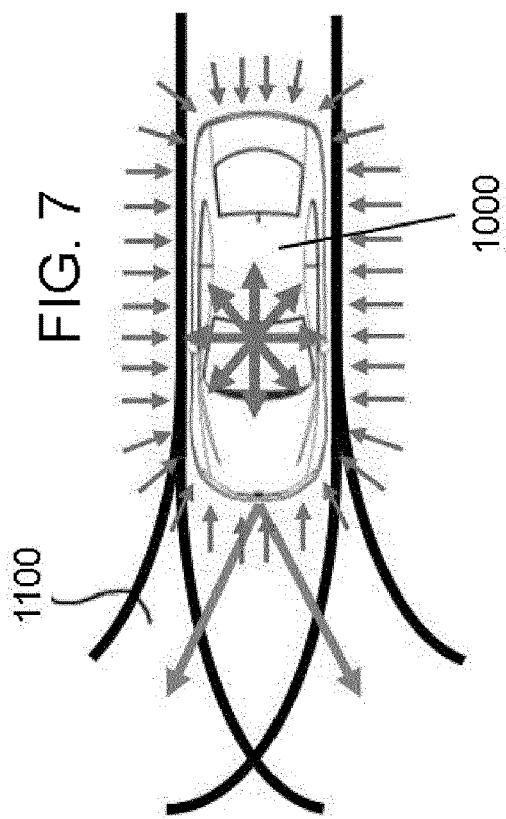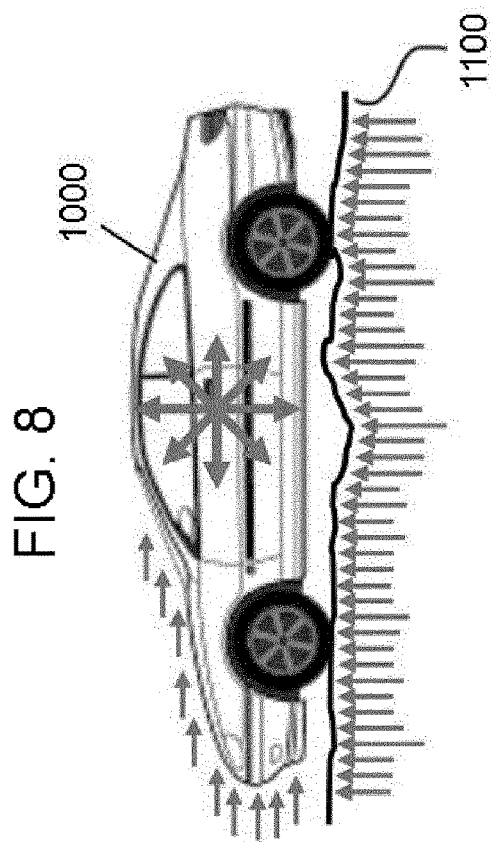

PIEZOELECTRIC GENERATOR SYSTEM AND ELECTRICAL SYSTEM INCLUDING SUCH PIEZOELECTRIC GENERATOR SYSTEM

This application claims the benefit of European Patent Application EP 15382601.1 filed 2 Dec. 2015.

The present disclosure relates to piezoelectric generator systems and electrical systems including such piezoelectric generator systems.

BACKGROUND

The continuous increase in Global demand for energy is one of the most important problems that currently exist, which causes deficit of energy sources, use of polluting energy sources, impacts on climate changes, diseases, reduction in life expectancy, poverty, hungry and wars for control of energy sources.

This has attracted considerably the attention in recent years and alternatives to polluting energy sources have been proposed such as renewable and sustainable energy sources. However, they do not provide enough energy for such an increase in demand of energy and therefore said non-environmentally friendly energy sources are still being massively used.

Clean energy sources such as hydraulic or eolic power plants, need large forces of the nature for generating power such as for example to move the turbines of a hydraulic power plant, large forces provided by the wind or by falling water are needed. This involves geographical limitations and consequently these generation plants can not deliver power in all parts of the Planet.

On the other hand, one of the greatest polluters is the transport, whether by road, sea or air, because they use fossil fuels.

For the above reasons, the electric vehicles are increasingly developed and used such as hybrid vehicles that combine an electric motor with a combustion engine. When a battery in a hybrid vehicle is exhausted, or additional power is needed for acceleration, or when a longer journey has to be made, a fuel engine is also required to continue circulating.

Although electric vehicles are becoming more popular, they suffer from a limited autonomy, as batteries should be recharged frequently.

For example, an electric vehicle using a 60 kWh battery has a driving autonomy of the order of about 370 km, and an electric vehicle using an 85 kWh battery has a driving autonomy of the order of about 480 km. Thus, although efforts have been made in the art to develop batteries with high energy density in order to increase the vehicle driving autonomy and to reduce the battery charge time, very large rechargeable batteries are still required to provide reasonable driving autonomy.

One alternative of charging batteries is to replace a weak or exhausted battery with another charged one. However high costs are involved in construction and maintenance of service stations for automated changing battery systems.

Recently, other technologies have been proposed such as to fully recharge a battery by removing the electrolyte or liquid inside the batteries through the use of special hoses, and replacing it with a fully charged electrolyte. Although this would substantially correspond to refuelling a vehicle so that existing service stations could be easily adapted to such application, a problem however exists that all brands should use such batteries and technology, which could be an obstacle.

In any case, regardless of the battery technology development in relation to increase energy density of the battery to provide more autonomy, and the development in relation to reduce recharge time, a great number of disadvantages are derived from prior art electric generator systems. They still provide very limited driving autonomy, batteries need to be recharged frequently, battery charging times are long, very large infrastructure investment is required, as well as problems related to saturation of electricity grids and therefore a need for increasing the number of electricity grids, etc.

Piezoelectric generators have been also proposed. They are based on an effect that consists in generation of electricity resulting from mechanical forces acting on piezoelectric elements. As early as 1880, Jacques and Pierre Curie discovered the piezoelectric phenomenon. When pressure or mechanical stress is applied on crystals such as quartz, tourmaline, topaz, cane sugar, Rochelle salt, etc. electrical potential charges are generated.

The piezoelectric effect is currently used in many applications such as for example electric generators. Piezoelectric generators comprise piezoelectric elements made of materials based on the piezoelectric effect, such that when they are under mechanical forces they become polarized and generate electricity according to the above mentioned piezoelectric phenomenon. The mechanical forces may for example come from a vehicle as it travels on the road e.g. forces resulting from the movement of shock absorbers fitted therein due to weight, motion, impacts, vibrations, etc. Generation of electricity resulting from such mechanical forces is thus known in the art.

For example, U.S. Pat. Nos. 3,559,027, 7,936,113 and 8,143,766 disclose the use of piezoelectric generators associated with shock absorbers or suspension of the vehicle. In use, the piezoelectric generator converts the mechanical energy applied into electric power for charging a battery such as for example to provide an additional source of energy to the vehicle or to aid in charging of the battery in hybrid vehicles.

In general, the piezoelectric generators known in the art typically comprise piezoelectric elements such as piezoelectric fiber composites and can be classified into two types.

A first group of piezoelectric generators are equipped with piezoelectric elements arranged in sheets superposed one above the other. For example, WO2006047926 discloses a piezoelectric generator associated with a vehicle suspension for generating electric power including a piezoelectric generators of the first group.

The main disadvantage in the first group of piezoelectric generators is that the output current generated in a piezoelectric element is small due to the stacked arrangement that results in that the force acting initially on the stack of piezoelectric elements only affects the piezoelectric elements in the outer layers of the stack and said force is gradually transmitted to the inner layers of the stack.

A second group of piezoelectric generators includes piezoelectric bars such as for example those described in BE881528A1, U.S. Pat. No. 8,143,766 or FR2619765.

The main disadvantage in the second group of piezoelectric generators is that the due to the use of piezoelectric bars, the force applied results in the torsion of the bars resulting in that force increases gradually and therefore current that is generated by the set piezoelectric elements is undesirably low.

In the prior art piezoelectric generators the piezoelectric elements are connected in series, then the output voltage is the sum of the voltages generated for all the piezoelectric elements. Thus, for obtaining high voltage output the force acting on the piezoelectric elements should be high. This results in high risk of damaging or breaking the piezoelectric elements whether they are of the above mentioned first or second groups of piezoelectric generators.

Thus, the piezoelectric generators that have been proposed so far for utilizing the energy associated for example with a vehicle suspension to provide electricity have been proved to be inefficient and insufficient for supplying an electric power for moving a motor vehicle. Therefore, prior art piezoelectric generators used in vehicles, etc. can only be used as an additional energy source to partially move a vehicle, etc.

A need therefore still exists for an electric generator capable of efficiently use kinetic energy, that is, dynamic forces or loads, to transform them into electric power to power cars, motorcycles, trucks, locomotives, trains, aircrafts, ships, machinery, etc.

There is also a need for electrical generators capable of generating electric power from small forces. Such electrical generators should be also capable of being mounted in any position so that said small forces, for example forces available geographically anywhere in the world, can be suitably received by the generator making it possible to reduce the above mentioned problems associated with the continuous increase of global energy demand.

SUMMARY

The present disclosure relates in general to the field of electric power generation and management, and specifically to piezoelectric generator systems which have been found to solve the above mentioned problems inherent to the prior art while providing a number of additional advantages over existing piezoelectric generators as it will be discussed hereinbelow.

A piezoelectric generator system is described having a large number of applications, such as electric vehicles or machines, whether they are land, aquatic or air vehicles or machines, applications for eolic and hydraulic power plant generation, applications associated with vehicles, people or animals moving on a ground surface, and applications associated with power generation in general, etc.

The present piezoelectric generator system comprises at least one piezoelectric generator unit. The piezoelectric generator system may include as many piezoelectric generator units as required for receiving mechanical dynamic loads or forces and convert them into electric power.

As used herein, dynamic mechanical loads or forces refer to loads or forces received by the piezoelectric generator unit or units whose values or vectors change over time. External forces or loads may be for example mechanical forces or loads continuously received and transmitted by vehicles travelling on a road, trains running on tracks, sailing boats, flying planes or vehicles driving on a track, people or animals walking on a road, that may be caused, for example, by the action of gravity proportional to the mass in motion, by uneven ground, by inertia due to acceleration, when braking, turning right or left, or even by wind or water resistance.

The present piezoelectric generator system is capable of converting kinetic energy due to such mechanical dynamic loads or forces into electric power to be used for operating a vehicle, machine, and power generation in general.

Each piezoelectric generator unit in the present piezoelectric generator system comprises an array of piezoelectric modules. As used herein, an array of piezoelectric modules refers to a number of electrically interconnected piezoelectric modules that are suitably arranged in virtual rows and columns forming a matrix. The matrix may be a square matrix, that is, with the same number of rows and columns; a rectangular matrix, that is, formed by a different number of rows and columns; or it may be an irregular matrix, that is, with varying number of elements in different rows and columns.

Each piezoelectric module comprises a piezoelectric element and an alternating current/direct current converter (AC/DC converter) which will be described further below.

Different materials can be used for the piezoelectric elements in the piezoelectric generator. For example, a ceramic material such as Lead Zirconate Titanate, also called PZT can be used. The PZT material provides a potential difference across two opposite surfaces of the piezoelectric when dynamic loads or forces are applied thereon. This material has been shown to have a relatively low operating temperature (200° C.), it is cost effective and it is physically strong and chemically inert. However, other suitable materials for the piezoelectric elements are of course not ruled out.

The area of the piezoelectric elements where dynamic loads or forces are applied is designed to be as small as possible, and such that their thicknesses are as large as possible. The piezoelectric elements are made robust enough to withstand dynamic loads or forces applied orthogonally to their area. However, this is not a critical point in the design of the piezoelectric elements, since, as it will be explained hereinbelow, the dynamic loads or forces are suitably controlled so as to protect the piezoelectric modules.

It is preferred that the piezoelectric elements in the array are of the same type in terms of at least piezoelectric material, shape and dimensions. However, the type of piezoelectric material, shape and dimensions of the piezoelectric elements in each piezoelectric module of the array could be different if required, as long as the voltage at the terminals of each set of piezoelectric modules connected in series is always the same so that they can be electrically connected to each other in parallel. Advantageously, this results in high output power being obtained due to the controlled conditions of the series and parallel connections of the piezoelectric modules in the array.

The above defined array of piezoelectric modules formed of a number of sets (virtual columns) of piezoelectric modules each formed of a number of piezoelectric modules (virtual rows) is arranged to supply high electric power, for example for powering a vehicle. As stated above, however, the present piezoelectric generator system is by no means limited to this application and can find a wide range of multiple different applications.

As stated above, each piezoelectric generator unit in the present piezoelectric generator system comprises an array of piezoelectric modules. Such array of piezoelectric modules comprises a number of sets of piezoelectric modules.

When designing a piezoelectric generator, the power that the piezoelectric generator is capable of generating should be known. The power is proportional to the voltage and the current, and consequently the generator should be designed in order to achieve the required voltage and current.

In order to obtain the required voltage, a number of piezoelectric modules are electrically connected in series considering that the output voltage will be the sum of the voltages generated for all the piezoelectric modules. These piezoelectric modules would correspond to virtual rows in said array of piezoelectric modules.

In order to obtain the required current, a number of sets of piezoelectric modules electrically connected in series will be then electrically connected in parallel considering that the output current will be the sum of the currents generated for all the sets of piezoelectric modules. These sets would correspond to virtual columns in the array of piezoelectric modules.

It is important to note that for the above electrical connection, the voltage at the terminals of all of the electrically connected sets of piezoelectric modules is the same.

The above mentioned AC/DC converter serves the purpose of converting alternating current generated by the piezoelectric element into direct current. Said AC/DC converter provided in each piezoelectric module is suitable for converting small alternating currents into a controlled output DC current. An electrical connection with other piezoelectric modules according to the above mentioned array is provided. This results in a continuous high power output to be obtained.

With the above array configuration, the present piezoelectric generator is capable of converting small forces acting on each piezoelectric element easily from alternating current into direct current. This is highly advantageous over the piezoelectric generators known in the art where the piezoelectric elements are connected in series and only the resulting current is converted from alternating current into continuous current such that low power is generated.

As stated above, the electric power that can be supplied by the array of piezoelectric modules comes from dynamic loads or forces. Said dynamic loads or forces act on the piezoelectric modules of the array and they are converted into a voltage that is substantially the same.

For this purpose, the dynamic loads or forces acting on the piezoelectric modules are controlled such that only a predetermined amount of force with a predetermined speed of application acts at the same time and during the same time on each set of piezoelectric modules. As a consequence, each and every piezoelectric module of the array receives the same amount of force at the same speed of application, at the same time and during the same time, so that current is simultaneously generated in all of the piezoelectric modules. This same amount of force will be referred herein to as predetermined triggering force or simply triggering force.

In order to set the amount of predetermined triggering force and the predetermined speed at which this force is applied on each piezoelectric module, an input force control device is provided. The input force control device is adapted for controlling the amount of triggering force that is applied and the speed at which this force is applied, so that it is applied at the same time and during the same time on the piezoelectric modules such that an electric output power is supplied by the piezoelectric generator unit.

The input force control device comprises an activation plate. Such activation plate may be formed of a single element suitable for mechanically acting on all the piezoelectric modules simultaneously in order to transmit the external dynamic loads or forces evenly to all of the piezoelectric elements. A guide mechanism may be provided for this purpose. The guide mechanism may include a number of aligned and calibrated guides arranged such that the plate element moves accurately in order to evenly distribute said dynamic loads or forces to the piezoelectric modules simultaneously. Said guides are so distributed throughout the piezoelectric generator that uniformity of the activation plate is ensured and such that uniform orthogonal forces act on all the piezoelectric modules, at the same speed of application, at the same time and during the same time.

The activation plate is arranged to be moved only when a predetermined amount of force has been reached, that is, when a predetermined triggering force preset value has been reached. When this happens, such force is transmitted by the activation plate to all the piezoelectric elements at the same predetermined speed. In this way, an effective energy management is performed such that voltage and current to be generated by the piezoelectric modules are directly and accurately controlled, as opposed to the piezoelectric generators described known in the art.

The input force control device further comprises a damping element. The damping element is adapted for damping the dynamic loads so as to protect the piezoelectric modules by absorbing the excess forces received by the piezoelectric elements. In one example, the damping element may be at least one selected from a mechanical, pneumatic, hydraulic, and magnetic element. In some of said examples, the damping element may comprise a rubber element of a suitable hardness arranged behind the piezoelectric modules so as to absorb said excess forces such that only a predetermined value of triggering force with a predetermined speed of application is only admitted on the piezoelectric modules. In this way, the piezoelectric modules and therefore the piezoelectric elements and other parts thereof are duly protected from being damaged.

With the above configuration, voltage and current are generated by the present piezoelectric generator system in a controlled manner. By controlling the triggering force F acting on the piezoelectric modules, the voltage generated by each piezoelectric module can be also controlled. Thus, considering that the voltage generated by the piezoelectric generator is proportional to the pressure applied on the piezoelectric modules:

$$V_{out} = -g_{33} \cdot h \cdot P,$$

wherein $g_{33}$ is a piezoelectric voltage constant in millivolts per meter/Newton corresponding to a ratio of a potential difference generated (in volts) to force F applied (in Newton) for a 1-meter-long piezoelectric element;

h is the thickness or height of the piezoelectric element; and

P is a pressure applied on the piezoelectric element; since the pressure is the force F applied perpendicular to a surface of the piezoelectric element per area over which that force is F distributed, that is, P=F/A, then:

$$V_{out} = g_{33} \cdot h \cdot \frac{F}{A}$$

In the same way, by controlling the speed at which the dynamic load or force is applied, the current $I_{out}$ from each piezoelectric element can be controlled since current I depends on the variation of electric charge (dQ) over time (dt):

$$I_{out} = \frac{dQ}{dt}$$

Thus, by applying the same amount of force, that is, the above mentioned triggering force, at the same predetermined speed, at the same time and during the same time to each and every piezoelectric module of the array of piezoelectric modules, a large amount of power is generated and transmitted from the array of piezoelectric modules.

With the configuration described above, a small amount of triggering force is only required to be applied on corresponding small areas of piezoelectric elements at high speed, that is, sharp impacts on the piezoelectric elements. Said small amount of triggering force generates small values of AC current in each piezoelectric element that are individually transformed by each AC/DC converter associated with each piezoelectric element into DC current. Since the piezoelectric elements are connected to one another in series and in parallel in the array, an increased output voltage and an increased output current are advantageously obtained resulting in high output power. This is highly advantageous as compared with prior art piezoelectric generators where high amounts of gradually increasing forces are required for obtaining small amounts of output power.

Stop members may be also included arranged for ensuring the activation plate of the input force control device always travels the same path to the piezoelectric modules such that the above mentioned triggering force acts perpendicular on the piezoelectric modules.

One or a number of electric power storage and supply devices may be included each including an electric power storage and supply unit. In some examples, the electric power storage and supply unit may be a battery. However, any other energy storage or accumulator and supply devices can be used as long as at least one of them is capable of working in one or more of the following operating conditions or modes:

The electric power storage and supply unit(s) is/are capable of working in a first, storage condition or mode, where it is (they are) capable of storing electric power. Where one or more electric power storage and supply units are fitted in vehicles such as cars, motorcycles, trucks, locomotives, trains, aircrafts, ships, or machinery, etc. they can be in such storage condition or mode while the vehicle, etc. is running or even when it is stationary, due to external dynamic loads or forces acting thereon.

The electric power storage and supply unit(s) is/are capable of working in a second, supply condition or mode, where it is (they are) capable of delivering electric power for example for powering cars, motorcycles, trucks, locomotives, trains, aircrafts, ships, machinery, etc.

The electric power storage and supply unit(s) may be also capable of working in a third, standby condition or mode. In this operating condition or mode, no electric power is stored in and no electric power is delivered by the electric power storage and supply unit. The electric power storage and supply unit(s) may be fully charged in this standby operating condition and waiting to be switched into a supply condition as required. Also in the standby operating condition the electric power storage and supply unit(s) may be uncharged because other power storage and supply unit(s) is/are in this moment in storage condition, and waiting to be switched into a storage condition when the other one is fully charged.

Other possible operating conditions or modes for the said electric power storage and supply units are not ruled out.

In order to receive the electric power from all the piezoelectric generators and supplying said electric power to the electric power storage and supply unit or units, at least one output control device may be also provided.

It may be preferred that a charge status monitoring device is further provided for monitoring at least one of the charge status and the above mentioned operating conditions or modes of at least one electric power storage and supply unit.

If provided, the charge status monitoring device is capable of performing a number of different functions.

For example, the charge status monitoring device may be capable of real time monitoring a number of parameters, such as for example the above mentioned storage, supply and standby operating modes of at least one electric power storage and supply unit. The charge status monitoring device may be also capable of real time monitoring the state of charge of at least one electric power storage and supply unit. This may be represented for example by a percentage.

The charge status monitoring device may also be capable of transmitting real time information on said parameters to an external system. The external system may include, for example, a display screen for displaying at least said information.

Switching between storage, supply and standby operating modes or conditions is carried out based on the charge status of the electric power storage and supply units. Switching between said operating modes or conditions may be performed by a switching device associated with the above charge status monitoring device.

There may be cases where the above mentioned charge status monitoring device is suitable for processing said information on parameters associated with the electric power storage and supply units and thus capable of sending instructions directly to the switching device to switch between said operating modes or conditions of the electric power storage and supply unit or units. In other cases, the charge status monitoring device only collects such information on parameters associated with the electric power storage and supply units and transmits it to the switching device. In this case, the switching device is responsible for processing said information so as to decide when the mode of operation of the electric power storage and supply unit should be switched.

There could be also cases where the present piezoelectric generator system has no charge status monitoring device. In this particular case, the switching device is adapted for automatically switching between said operating modes or conditions of the power storage and supply units depending on the charge status thereof.

As to the above switching device, it may be adapted for operating at least in the following situations.

The switching device is capable of switching one or more of the electric power storage and supply units from supply condition into storage condition when the electric power storage and supply unit or units has/have been exhausted or depleted to a predetermined minimum acceptable charge, such as for example 5%, has been reached and there are no power storage and supply units at that time in storage mode.

The switching device is also capable of switching one or more of the electric power storage and supply units from supply condition into standby condition when said electric power storage and supply unit or units has/have been exhausted or depleted and a predetermined minimum acceptable charge, such as for example 5%, has been reached and at least one additional electric power storage and supply unit is available in storage mode.

The switching device is also capable of switching one or more of the electric power storage and supply units from storage condition into standby condition when said electric power storage and supply unit or units is/are fully charged and waiting for switching into the supply condition.

The switching device is also capable of switching one or more of the electric power storage and supply units from storage into supply condition when power has to be supplied because at least one electric power storage and supply unit, that was/were previously in the supply condition, has/have been fully exhausted or depleted or a predetermined minimum acceptable charge, such as for example 5%, has been reached and is/are switched into storage mode or standby mode.

The switching device is also capable of switching one or more of the electric power storage and supply units from standby condition into storage condition when at least one electric power storage and supply unit, that was/were previously in storage condition, has/have been fully recharged and is/are switched into standby mode or supply mode.

Finally, the switching device is also capable of switching one or more of the electric power storage and supply units from standby condition into supply condition in case the electric power storage and supply unit or units was/were previously in supply condition has/have been fully exhausted or depleted or a predetermined minimum acceptable charge, such as for example 5%, and is/are switched into standby mode or storage mode.

In any case, it is important to note that the piezoelectric generator(s) in the present system should be sized such that the time needed for fully charging an electric power storage and supply unit is shorter than the time taken by electric power storage and supply unit for being discharged when electric power is delivered. Thus, recharge of electric power storage and supply units is performed faster than discharge of electric power storage and supply units when the vehicle, machine, etc. is in use or is being operated. As a result, the piezoelectric generator system is capable of providing an electric vehicle or machine with an unlimited autonomy.

The present disclosure also refers to an electrical system that includes the piezoelectric generator system described above as a power source.

For example, the piezoelectric elements of each piezoelectric generator system of said electrical system may be driven by at least one dynamic load that is generated from one or more moving parts of at least one of an electric vehicle and electric machine. Thus, the present piezoelectric generator system can be installed on any type of electrical machinery such that all possible dynamic loads or forces can be transformed into electric power, whether they come from external causes or the own vibration of the machine.

In the above example where the electrical system is associated with an electric land vehicle, multiple piezoelectric generators may be adapted to be mounted at one or more locations of a vehicle. Such locations may be one or more selected from at least one of the bottom portion of a shock absorber where the shock absorber is connected to a vehicle steering; between a shock absorber spring and a shock absorber spring lower support; between shock absorbers and suspensions; between the motor and a motor locking system; between suspensions and a vehicle body; between a vehicle frame front axle and a vehicle body; between a vehicle frame rear axle and a vehicle body; and under the seats of the vehicle. However, the present piezoelectric generator system described can be mounted in any other position of a vehicle where dynamic loads or forces can be received to be transformed into electric power.

In the examples where the present piezoelectric generator system is installed in a watercraft, the watercraft continuously receives external forces such as from the waves and the wind even when it is tied with the engine switched off. In this case, multiple piezoelectric generators can be installed in several positions of the ship where both external and internal dynamic loads or forces can be received, such as from submerged parts and outside parts of the hull, as well as in seats of the crewmembers and passengers, across the floor, etc.

In the examples where the present piezoelectric generator system is installed in air vehicles, the forces received during take-off, during the flight, during landing and during transit of the vehicle through the tracks are extreme and therefore a great source of energy is available. Multiple piezoelectric generators can be installed in several positions of the vehicle for receiving both external and internal dynamic loads such as in shock dampers, wings, in other parts of the fuselage, in the seats of crewmembers and passengers, etc.

Thus, taking advantage of loads and forces received as well as high vibrations on the entire apparatus a huge amount of energy can be generated that can be stored in the batteries for charging them when the plane is taking off again as it is the phase of flight when more energy is consumed.

Still another example of application for the present piezoelectric generator system corresponds to dynamic loads generated from forces of the nature such as the water or the wind. In this case, the piezoelectric generator can be installed in hydroelectric or Eolic plants obtaining important advantages. One important advantage is that the present piezoelectric generator is capable of generating energy from small forces making it possible to be installed in multiple locations of the plant taking advantage of many more dynamic loads or forces around. A further important advantage is that the present piezoelectric generator is much more efficient in the transformation of mechanical energy into electric power such that with the same force much more power can be generated taking less space than energy generation current methods. For example, the present piezoelectric generator can be also installed in riverbeds, on the seabed, on the coasts, on the slopes of the mountains, on facades in high buildings, and in general anywhere where a significant number of small forces can be collected.

Still a further example of application of the present piezoelectric generator is to transform the mechanical energy generated by vehicles such as cars, motorcycles, trucks, trains, trams and even people or animals travelling on a road, on a track, on the street and also in buildings, farms, etc., into electricity. In this case, a number of the present piezoelectric generators are mounted on transit roads, highways, tracks, etc. This is also applicable to aircrafts during take-off or landing to take advantage of the movement on the runway.

Apart from the above possible applications of the present piezoelectric generator system for vehicles such as cars, motorcycles, trucks, planes, ships, etc., travelling on roads, as well as trains, trams etc. travelling on railway tracks, other applications are of course not ruled out.

Thus, the present piezoelectric generator system finds application in a high variety of fields such as transportation, in electric land, marine and air-borne vehicles, motorcycles, trucks, locomotives, trains, aircrafts, ships, as well as machinery in general, Eolic and hydraulic applications and many other such as those associated with vehicles, people or animals moving on a ground surface, etc.

The present piezoelectric generator system can be applied to at least any of the above mentioned applications without particular changes on its parts. Minimal changes, such as for example the shape of the piezoelectric modules, would only be required to adapt to the particular application depending on where the generator is to be placed and the activation plate associated therewith. In any case, the operating principle of the present piezoelectric generator system always remain the same as described above.

In all of above applications as well as in many others, the present piezoelectric generator system has been found to provide high power DC output while contributes to an improvement of environmentally-friendly and renewable resources.

With the present piezoelectric generator system, unlimited autonomy of operation is advantageously provided such that no refuelling or battery recharging is required regardless of the application which this piezoelectric generator system is used for.

Additional objects, advantages and features of examples of the present piezoelectric generator system will become apparent to those skilled in the art upon examination of the description, or may be learned by practice thereof.

BRIEF DESCRIPTION OF THE DRAWINGS

The present piezoelectric generator system will be described in the following by way of a non-limiting example with reference to the appended drawings, in which:

FIG. 6 is a graph showing changes in electric power levels of the first and second batteries over time as well as switching between battery operating condition or modes;

FIG. 7 is a diagrammatic top plan view of the land vehicle where the present piezoelectric generator system is installed and representations of examples of mechanical dynamic loads or forces involved therein;

FIG. 8 is a side elevational view of the land vehicle shown in FIG. 7; and

DETAILED DESCRIPTION OF ONE EXAMPLE

Figure 1:
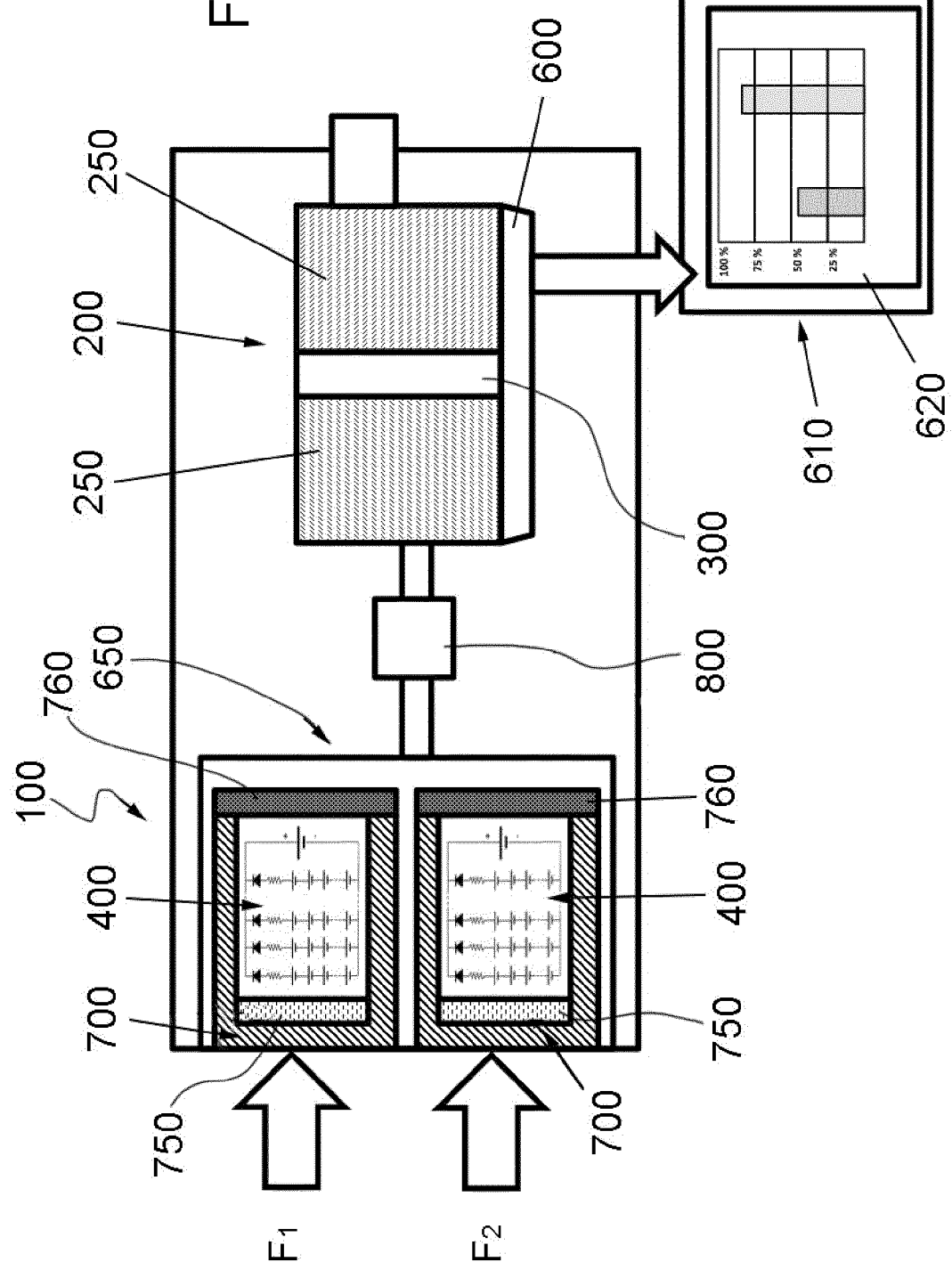
FIG. 1 is a diagrammatic view of one example of a piezoelectric generator system.

The example of the piezoelectric generator system that is given below in connection with figures has been indicated as a whole by reference numeral 100.

The piezoelectric generator system 100 of the example has a large number of applications, such as land, aquatic and air electric vehicles or machines, as well as other applications such as Eolic and hydraulic power plants and even applications associated with vehicles, people or animals moving on a ground surface, and applications associated with power generation in general, etc.

In the particular non-limiting example shown, the piezoelectric generator system 100 is used in the electric vehicle 1000 shown in FIG. 7 and FIG. 8 of the drawings. Specific details of the electric vehicle 1000 will be given below.

In the example, the piezoelectric generator system 100 is equipped with one piezoelectric generator unit 650. Those skilled in the art will however realise that any other number of generator units 650 can be included as required depending on the specific application.

The piezoelectric generator unit 650 is installed in different suitable positions of the electric vehicle 1000 for receiving mechanical dynamic loads or forces $F_1, F_2 \ldots F_n$ and convert them into electric power. The specific positions of the piezoelectric generator units 650 should be such that the use of said mechanical dynamic loads or forces $F_1, F_2 \ldots F_n$ involved in the electric vehicle 1000 is optimized. Examples of positions where the piezoelectric generator units 650 can be placed in the electric vehicle 1000 may be the bottom of shock absorber where it is connected to vehicle steering, between the shock absorber spring and the shock absorber spring lower support, between the shock absorbers and the suspensions of the electric vehicle 1000, between the motor and the motor locking system, between the suspensions and the body of the electric vehicle 1000, between the front axle of the frame of the electric vehicle 1000 and the body of the electric vehicle 1000, between the rear axle of the frame of the electric vehicle 1000 and the body of the electric vehicle 1000, and under seats of the electric vehicle 1000, etc. Other positions are of course possible for suitably receiving mechanical dynamic loads or forces $F_1, F_2 \ldots F_n$ from the electric vehicle 1000 and convert them into electric power.

Thus, in the present specific example, the piezoelectric generator system 100 comprises one piezoelectric generator unit 650 that is installed in the electric vehicle 1000 such that mechanical dynamic loads or forces $F_1, F_2 \ldots F_n$ are received and transmitted by the suspension as the electric vehicle 1000 is travelling on a road 1100 due to uneven ground, inertia due to acceleration, braking, turning right or left, or even by wind resistance.

Each generator unit 650 in the example comprises an array 400 of electrically interconnected piezoelectric modules $M_{ji,i}$. One non-limiting example of the array 400 of piezoelectric modules $M_{ji,i}$ has been shown in FIG. 4 of the drawings. The array 400 comprises a number of interrelated piezoelectric modules $M_{ji,i}$ arranged in rows and columns as it will be explained further below also in connection with FIG. 4, forming a matrix. The matrix defined by the array 400 is in this case a square matrix. The matrix might be however rectangular or irregular matrix as required.

Figure 3:
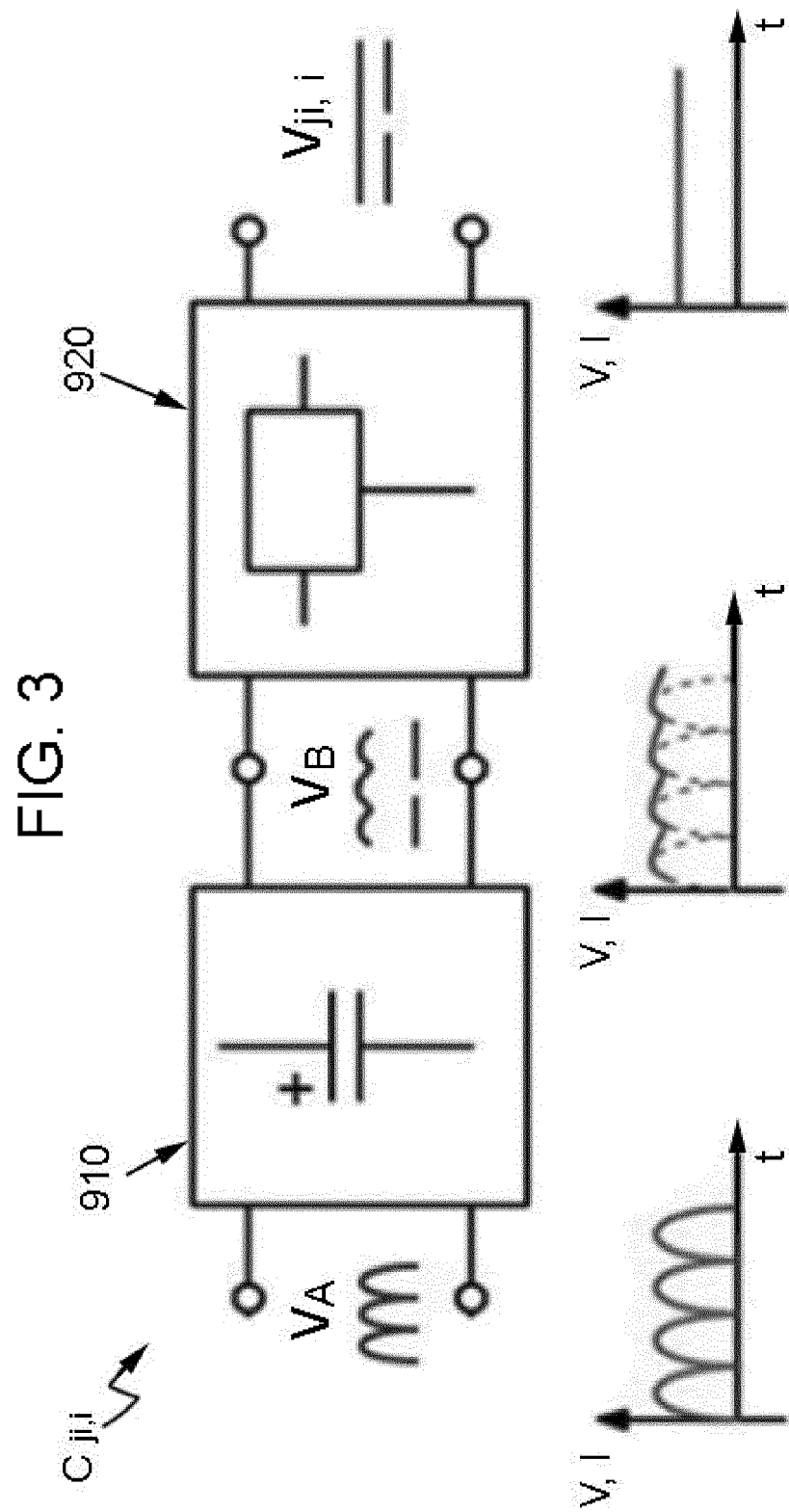
FIG. 3 is a diagrammatic circuit diagram of one example of an AC/DC converter that is part of the piezoelectric module shown in FIG. 2 with graphs showing different forms of the voltage across the different stages of the AC/DC converter.
Figure 4:
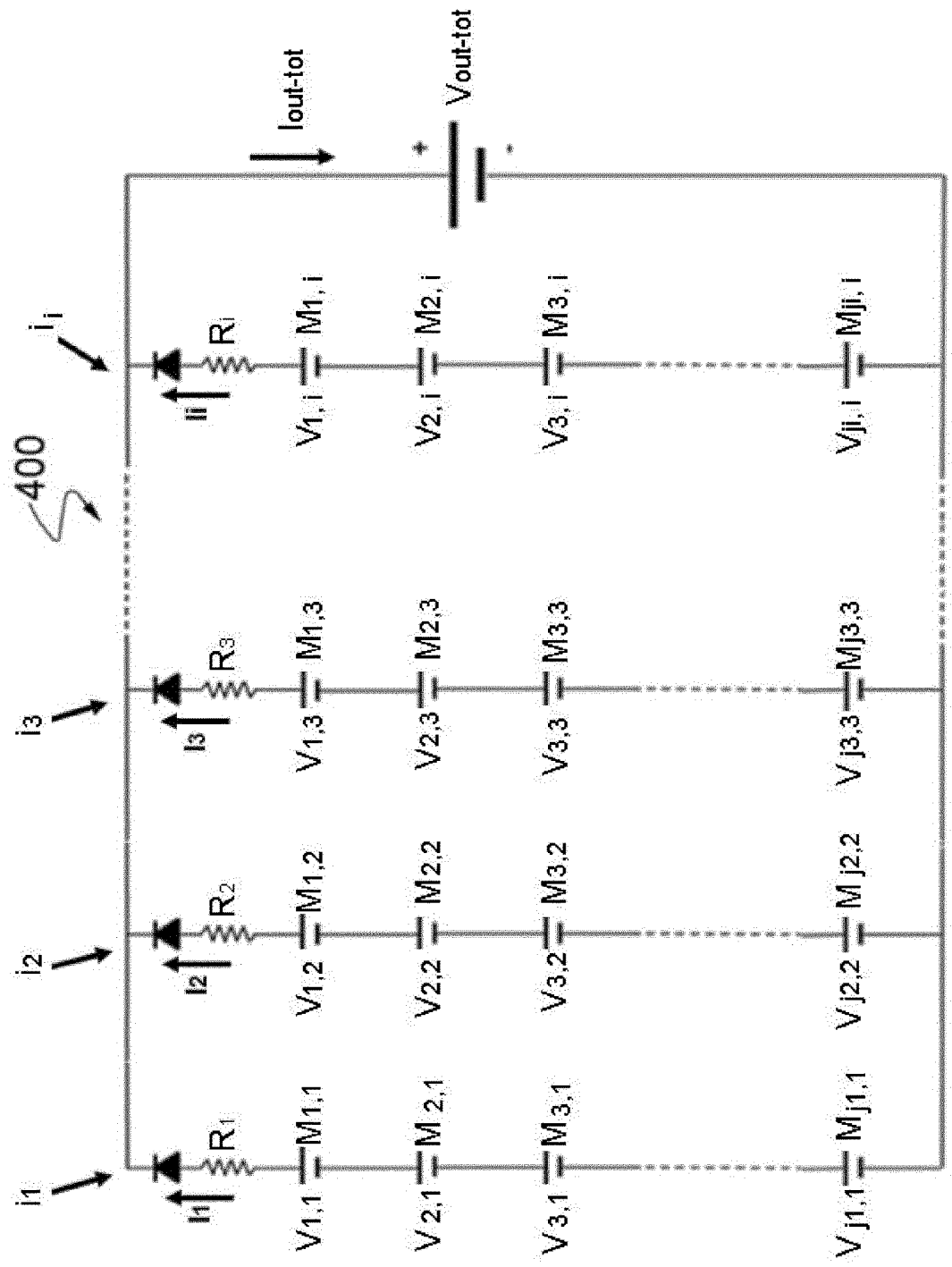
FIG. 4 is a diagrammatic view of one array of piezoelectric modules.

Referring to FIG. 3 of the drawings, each piezoelectric module $M_{ji,i}$ comprises a piezoelectric element $E_{ji,i}$ and an alternating current/direct current converter (AC/DC converter) $C_{ji,i}$. The piezoelectric element $E_{ji,i}$ and the AC/DC converter $C_{ji,i}$ are both encapsulated in the piezoelectric module $M_{ji,i}$. As shown in FIG. 3, the AC/DC converter $C_{ji,i}$ includes a filter stage 910 and a voltage regulator stage 920. In the AC/DC converter $C_{ji,i}$ shown, the voltage $V_A$ from a piezoelectric element $E_{ji,i}$ is converted into a reduced ripple voltage $V_B$ as current passes through the filter stage 910 which is then converted into a DC voltage $V_{ji,i}$ after passing through the voltage regulator stage 920, with an output DC current $I_{ji,i}$ As shown in FIG. 4, the array 400 of piezoelectric modules $M_{ji,i}$ comprises a number of sets i of piezoelectric modules $M_{ji,i}$. The number $j_1, j_2, j_3, \ldots j_i$ of piezoelectric modules $M_{ji,i}$ in each set i are electrically connected to each other in series. Each piezoelectric module $M_{ji,i}$, in turn, comprises the above mentioned piezoelectric element $E_{ji,i}$ and the AC/DC converter $C_{ji,i}$. The sets i of piezoelectric modules $M_{ji,i}$ are electrically connected to each other in parallel.

The AC/DC converter $C_{ji,i}$ in each piezoelectric module $M_{ji,i}$ is capable of converting small alternating currents generated by the force F acting on each piezoelectric element $E_{ji,i}$ into a controlled output DC current as it will be described further below. As a result, continuous high power output is advantageously obtained.

According to the above, the array 400 of piezoelectric modules $M_{ji,i}$ is defined by a matrix comprising a number of columns (sets i of piezoelectric modules $M_{ji,i}$) and a number of rows ($j_1, j_2, j_3, \ldots j_i$ piezoelectric modules $M_{ji,i}$). The columns i and the rows $j_1, j_2, j_3, \ldots j_i$ of the array 400 are arranged to supply electric power to the electric vehicle 1000. Thus, the array 400 of piezoelectric modules $M_{ji,i}$ can be then defined generally by the following matrix:

$$M_{1,1}, M_{1,2}, M_{1,3}, \ldots, M_{1,i}$$
$$M_{2,1}, M_{2,2}, M_{2,3}, \ldots, M_{2,i}$$
$$M_{3,1}, M_{3,2}, M_{3,3}, \ldots, M_{3,i}$$
$$\ldots$$
$$M_{j1,1}, M_{j2,2}, M_{j3,3}, \ldots, M_{ji,i}$$

In the example that is described herein, all the piezoelectric elements $E_{ji,i}$ included in the array 400 are of the same type in terms of piezoelectric material (they are all made PZT, lead zirconate titanate), geometry (they are cylindrical in shape) and dimensions (they all have an area A where the force F to be applied that is as small as possible, and they all have a thicknesses as large as possible).

The above configuration of the array 400 of electrically interconnected piezoelectric modules $M_{ji,i}$ results in that the voltage $V_{out}$ at the terminals in all of the electrically connected sets i of piezoelectric modules $M_{ji,i}$ is the same.

For controlling and adjusting the dynamic loads or forces $F_1, F_2 \ldots F_n$ involved in the electric vehicle 1000 so as to have a predetermined triggering force F acting at the same time and during the same time on each set i of piezoelectric modules $M_{ji,i}$, an input force control device 700 is provided.

Figure 2:
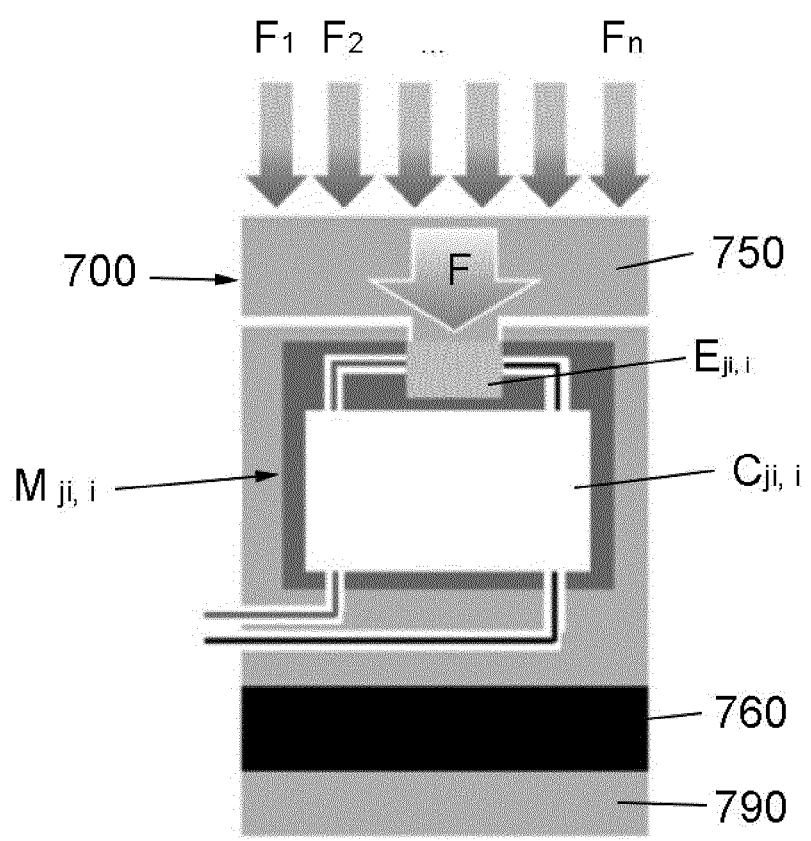
FIG. 2 is a diagrammatic view of one piezoelectric module.
Figure 5:
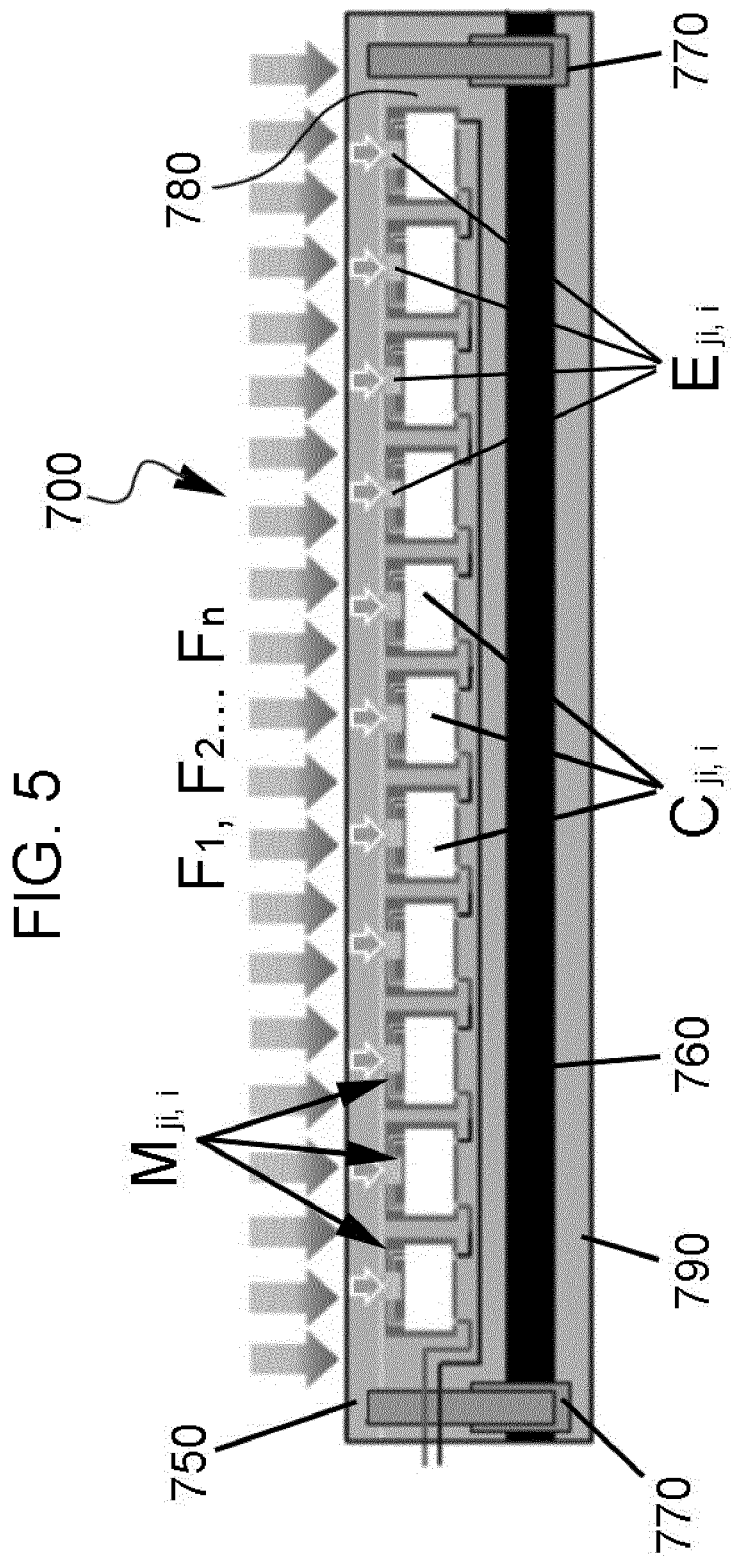
FIG. 5 is a diagrammatic view of one piezoelectric generator unit.

One example of an input force control device 700 is shown in FIGS. 1, 2 and 5. In this example, the input force control device 700 comprises an activation plate 750, a damping element 760, a guide mechanism 770 and a fixing plate 780.

The activation plate 750 of the input force control device 700 is formed of a single element arranged to be moved only when a predetermined amount of a triggering force F has been reached. Such predetermined triggering force F is thus transmitted by the activation plate 750 simultaneously and evenly on all the piezoelectric modules $M_{ji,i}$ of the piezoelectric generator unit 650.

The guide mechanism 770 of the input force control device 700 is shown in FIG. 5. The guide mechanism 770 is intended for guiding the activation plate 750 when it is driven by the dynamic loads or forces $F_1, F_2 \ldots F_n$ from the vehicle 1000. For this purpose, the guide mechanism 770 includes a number of aligned and calibrated guides arranged such that the activation plate 750 moves accurately to evenly distribute said predetermined amount of force F with a predetermined speed at which said force F is applied to the piezoelectric modules $M_{ji,i}$. The guide mechanism 770 cooperates for ensuring that the force F is applied orthogonally on all the piezoelectric modules $M_{ji,i}$ at the same speed of application, at the same time, and during the same time.

The damping element 760 of the input force control device 700 is intended for damping the dynamic forces or loads $F_1, F_2 \ldots F_n$ from the vehicle 1000 in order to prevent the piezoelectric modules $M_{ji,i}$ from being damaged by excess forces or loads $F_1, F_2 \ldots F_n$. In the example shown in FIGS. 1, 2 and 5, the damping element 760 comprises a rubber pad of a suitable hardness that is arranged behind the piezoelectric modules $M_{ji,i}$.

The fixing plate 780 of the input force control device 700 is shown in FIG. 5. The main purpose of the fixing plate 780 is the attachment of the piezoelectric modules $M_{ji,i}$. The piezoelectric modules $M_{ji,i}$ are calibrated in order that all have the same positioning and all have a perfect planarity. A further purpose of the fixing plate 780 is to robustly hold the activation plate 750 so as to further cooperate in distributing evenly the predetermined amount of force F with a predetermined speed at which said force F is applied as stated above.

A back cover 790 is also provided in the piezoelectric generator system 100 for closing the generator units 650 and for attachment to a suitable part of the electric vehicle 1000 as described above.

Turning now to FIG. 1 of the drawings, an electric power storage and supply device 200 is provided each comprising two electric power storage and supply units 250 as shown in FIG. 1. In the particular case herein described, each electric power storage and supply unit comprises a battery 250. Thus, an electric power storage and supply unit 250 will be hereinafter referred to as battery 250. Therefore, in this example, the electric power storage and supply device 200 comprises a first battery 250 and a second battery 250.

In the present piezoelectric generator system 100, the first and the second battery 250 in the generator unit 650 is capable of working in three different operating conditions or modes:

a first, storage operating condition or mode, where the battery 250 is capable of storing electric power that is generated by the corresponding piezoelectric generator unit 650;

a second, supply operating condition or mode, where the battery 250 is capable of delivering electric power for powering the electric vehicle 1000; and a third, standby operating condition or mode, where no electric power is stored in and no electric power is delivered by the battery 250 to the electric vehicle 1000.

If required, more batteries 250 could be provided working in different operating conditions or modes. In general, any of the batteries 250 in each electric power storage and supply device 200 is capable of working according to the above mentioned three operating conditions or modes.

Switching between battery operating conditions or modes is now described in connection with the graph depicted in FIG. 6 of the drawings. In said graph, the line A corresponds to the electric power level of the first battery 250 while the line B corresponds to the electric power level of the second battery 250.

According to FIG. 6, at time T0, the first battery 250 is in a fully charged condition, that is at its maximum value of electric power level (max) shown by line A. Thus, the first battery 250 is ready to work in the supply operating condition supplying electric power to the electric vehicle 1000. On the other hand, the second battery 250 is at its minimum level of electric power, that is at its minimum value of electric power level (min) shown by line B. Thus, the second battery 250 is ready to work in the storage operating condition, for storing electric power generated by the corresponding piezoelectric generator unit 650 in the electric vehicle 1000.

During time interval ⬜T0–T1, the first battery 250 is in the supply operating condition, supplying electric power to the electric vehicle 1000. For this reason, its value of electric power level shown by line A decreases over time t. On the other hand, the second battery 250 is in the storage operating condition storing electric power generated by the corresponding piezoelectric generator unit 650 in the electric vehicle 1000. For this reason, its value of electric power level shown by line increases over time t.

At time T1 a maximum value of the electric power level (max) of the second battery 250 is reached while the electric power level of the first battery 250 shown by line A is still decreasing.

During time interval ⬜T1–T2, the maximum value of the electric power level (max) of the second battery 250, shown by line B, remains constant while the second battery 250 remains in standby operating condition in said maximum value of electric power level (max). During said time interval ⬜T1–T2, the electric power level of the first battery 250, shown by line A, that is still in the supply operating condition, is still decreasing.

At time T2 a minimum value of the electric power level (min) of the first battery 250 is reached. Also at time T2, switching between operating conditions of both batteries 250 occurs. The supply operating condition of the first battery 250 is switched into the storage operating condition such that from time T2 the first battery 250 starts storing electric power generated by the corresponding piezoelectric generator unit 650 and therefore its value of electric power level shown by line increases over time t shown by line A from time T2. At the same time T2, the second battery 250 is switched into the supply operating condition for powering the electric vehicle 1000 such that from said time T2 the second battery 250 starts supplying electric power to the electric vehicle 1000 so that its value of electric power level shown by line decreases over time t shown by line B from time T2.

During time interval ⬜T2–T3, a maximum value electric power level (max) of the first battery 250, shown by line A, is reached, while the electric power level of the second battery 250 shown by line B still decreases over time t.

At time interval ⬜T3–T4, the maximum value of the electric power level (max) of the first battery 250, shown by line A, remains constant while said first battery 250 remains in the standby operating condition in said maximum value of electric power level (max). During said time interval ⬜T3–T4, the electric power level of the second battery 250, shown by line B, that is still in the supply operating condition, is still decreasing.

At time T4 a further minimum value of the electric power level (min) of the second battery 250 is reached. Also at time T4, a further switching between operating conditions of both batteries 250 occurs. The standby operating condition of the first battery 250 is switched into the supply operating condition for supplying electric power to the electric vehicle 1000 and therefore its electric power level shown by line A decreases. At the same time, the second battery 250 is switched into the storage operating condition for storing electric power generated by the corresponding piezoelectric generator unit 650 and therefore its electric power level depicted by line B increases.

It is important to note that, as shown in FIG. 6 of the drawings, the time interval ⬜T0–T1 is shorter that the time interval ⬜T0–T2. This means that charging time of the second battery 250 to reach its maximum electric power level (max) is always shorter than discharging time of the first battery 250. Likewise, the time interval ⬜T2–T3 is shorter that the time interval ⬜T2–T4. This means that charging time of the first battery 250 to reach its maximum electric power level (max) is always shorter than discharging time of the second battery 250.

In general, the piezoelectric generator units 650 are sized such that the charging time needed for fully charging a battery 250 is shorter than the charging time taken for fully discharging the battery 250 when electric power is supplied to the electric vehicle 1000.

⬜⬜

The above cycle shown in FIG. 6 is repeated indefinitely, or at least whenever external dynamic forces or loads $F_1, F_2 \ldots F_n$ are received, resulting in unlimited autonomy of operation of the electric vehicle 1000 as outside battery recharging operations are not required.

Switching between said storage, supply and standby operating modes or conditions of the batteries 250 is carried out by means of a switching device 300. The switching device 300 is capable of switching between the above mentioned operating modes or conditions based on the charge status of the batteries 250. It is envisaged that switching between the operating modes or conditions of the batteries 250 may be performed automatically as required.

The switching device 300 is associated with a charge status monitoring device 600. The charge status monitoring device 600 is capable of monitoring in real time the charge status of the batteries 250 in the electric power storage and supply device 200, which may be represented for example by a percentage, and their operating conditions or modes. The charge status monitoring device 600 is also capable of transmitting real time information on said parameters to an external system 610. The external system 610 is diagrammatically shown in FIG. 1 including a display screen 620 for displaying said information from the charge status monitoring device 600 and other parameters relating to the batteries 250 and other parts of the electric power storage and supply device 200.

As shown in FIG. 1, an output control device 800 is also provided. The output control device 800 is intended to ensure that electric power is received from all the piezoelectric generator units 650 and that said electric power is supplied to the batteries 250.

One example of sizing of the generator unit 650 and, in particular, the array 400 of piezoelectric modules $M_{ji,i}$, of the present piezoelectric generator system 100 in the electric vehicle 1000 is given below.

The electric vehicle 1000 of the example is equipped with two standard batteries 250 each with a battery capacity BC of 60 KWh. This gives the electric vehicle 1000 an autonomy A of 370 km. Considering a maximum authorised speed of 130 km/h, the maximum recharging time $Rt_{max}$ of each battery 250 is 2.85 hours.

From the above, the minimum output electric power $P_{out}$ of each piezoelectric generator unit 650 can be calculated in order to provide unlimited autonomy to the electric vehicle 1000 considering the above charging time for each of said two batteries 250 and an efficiency $\varphi$ of about 75%. Thus:

$$P_{out} = \frac{BC}{Rt_{max}} \cdot \varphi$$

$$P_{out} = \frac{60}{2.85} \cdot (1 + (1 - 0.75)) = 26.35 KW$$

Accordingly, the piezoelectric generator unit 650 of the piezoelectric generator system 100 should be able to generate a theoretical electric power $P_{out-tot-T}$ of about 26350 W. It is to be noted that in this example, the electric power $P_{out-tot-T}$ of each piezoelectric generator unit 650 has been determined in a worst-case scenario, that is, considering the above mentioned efficiency of 75%, for recharging a 60 kWh standard battery 250 for an driving autonomy of 370 km during a travelling time of 2.85 hours at a constant speed of 130 km/h.

The output voltage $V_{out}$ that can be generated by each piezoelectric generator unit 650 is proportional to the pressure P that is applied on the piezoelectric modules $M_{ji,i}$ according to a piezoelectric voltage constant $g_{33}$. Such piezoelectric voltage constant $g_{33}$ (given in volts per meter/ Newton, Vm/N) corresponds to a ratio of a potential difference (volts) that is generated by forces or loads $F_1, F_2 \ldots F_n$ being applied (Newton) for a 1-meter-long piezoelectric element. Thus:

$$V_{out} = g_{33} \cdot h \cdot P$$

As stated above, the piezoelectric elements $E_{ji,i}$ in the piezoelectric modules $M_{ji,i}$ are cylindrical in shape. Each piezoelectric element $E_{ji,i}$ is 3 mm in height h and 5 mm in diameter d.

Considering a pressure P applied on each piezoelectric element $E_{ji,i}$ corresponding to a force or load F per area A applied perpendicular to their surface over which said force or load F is distributed, that is, P=F/A, then:

$$V_{out} = g_{33} \cdot h \cdot \frac{F}{A} = g_{33} \cdot h \cdot \frac{F}{\pi \cdot \left(\frac{d}{2}\right)^2}$$

Using piezoelectric modules $M_{ji,i}$ comprising piezoelectric elements $E_{ji,i}$ with a piezoelectric voltage constant $g_{33}$ of 0.035 Vm/N, then each piezoelectric element $E_{ji,i}$ is capable of generating the following output voltage $V_{out}$ when a triggering force F received by each of the piezoelectric modules $M_{ji,i}$ is set by the input force control device 700 to be 5 N:

$$V_{out} = g_{33} \cdot h \cdot \frac{F}{A} = 0.035 \cdot 0.003 \cdot \frac{5}{\pi \cdot 0.0025^2} = 26.74 V$$

Other values for the output voltage $V_{out}$ can be considered according to the parameters of force F and dimensions of the piezoelectric elements $E_{ji,i}$ according to multiple configurations as shown in the following Table 1.

TABLE 1

| Configuration | g33 (Vm/N) | Thickness h (m) | Diameter D (m) | Output tension (V) for F = 5 N | Output tension (V) for F = 6 N | Output tension (V) for F = 7 N | Output tension (V) for F = 8 N | Output tension (V) for F = 9 N | Output tension (V) for F = 10 N |
|---|---|---|---|---|---|---|---|---|---|
| 1 | 0.03 | 0.0015 | 0.005 | 11.46 | 13.75 | 16.04 | 18.33 | 20.63 | 22.92 |
| 2 |  | 0.002 |  | 15.28 | 18.33 | 21.39 | 24.45 | 27.50 | 30.56 |
| 3 |  | 0.0025 |  | 19.10 | 22.92 | 26.74 | 30.56 | 34.38 | 38.20 |
| 4 |  | 0.003 |  | 22.92 | 27.50 | 32.09 | 36.67 | 41.25 | 45.84 |
| 5 | 0.035 | 0.0015 |  | 13.37 | 16.04 | 18.72 | 21.39 | 24.06 | 26.74 |
| 6 |  | 0.002 |  | 17.83 | 21.39 | 24.96 | 28.52 | 32.09 | 35.65 |
| 7 |  | 0.0025 |  | 22.28 | 26.74 | 31.19 | 35.65 | 40.11 | 44.56 |
| 8 |  | 0.003 |  | 26.74 | 32.09 | 37.43 | 42.78 | 48.13 | 53.48 |
| 9 | 0.04 | 0.0015 |  | 15.28 | 18.33 | 21.39 | 24.45 | 27.50 | 30.56 |
| 10 |  | 0.002 |  | 20.37 | 24.45 | 28.52 | 32.59 | 36.67 | 40.74 |
| 11 |  | 0.0025 |  | 25.46 | 30.56 | 35.65 | 40.74 | 45.84 | 50.93 |
| 12 |  | 0.003 |  | 30.56 | 36.67 | 42.78 | 48.89 | 55.00 | 61.12 |
| 13 | 0.03 | 0.0015 | 0.006 | 7.96 | 9.55 | 11.14 | 12.73 | 14.32 | 15.92 |
| 14 |  | 0.002 |  | 10.61 | 12.73 | 14.85 | 16.98 | 19.10 | 21.22 |
| 15 |  | 0.0025 |  | 13.26 | 15.92 | 18.57 | 21.22 | 23.87 | 26.53 |
| 16 |  | 0.003 |  | 15.92 | 19.10 | 22.28 | 25.46 | 28.65 | 31.83 |
| 17 | 0.035 | 0.0015 |  | 9.28 | 11.14 | 13.00 | 14.85 | 16.71 | 18.57 |
| 18 |  | 0.002 |  | 12.38 | 14.85 | 17.33 | 19.81 | 22.28 | 24.76 |
| 19 |  | 0.0025 |  | 15.47 | 18.57 | 21.66 | 24.76 | 27.85 | 30.95 |
| 20 |  | 0.003 |  | 18.57 | 22.28 | 26.00 | 29.71 | 33.42 | 37.14 |
| 21 | 0.04 | 0.0015 |  | 10.61 | 12.73 | 14.85 | 16.98 | 19.10 | 21.22 |
| 22 |  | 0.002 |  | 14.15 | 16.98 | 19.81 | 22.64 | 25.46 | 28.29 |
| 23 |  | 0.0025 |  | 17.68 | 21.22 | 24.76 | 28.29 | 31.83 | 35.37 |
| 24 | 0.03 | 0.003 | 0.007 | 21.22 | 25.46 | 29.71 | 33.95 | 38.20 | 42.44 |
| 25 |  | 0.0015 |  | 5.85 | 7.02 | 8.19 | 9.35 | 10.52 | 11.69 |
| 26 |  | 0.002 |  | 7.80 | 9.35 | 10.91 | 12.47 | 14.03 | 15.59 |
| 27 |  | 0.0025 |  | 9.74 | 11.69 | 13.64 | 15.59 | 17.54 | 19.49 |
| 28 |  | 0.003 |  | 11.69 | 14.03 | 16.37 | 18.71 | 21.05 | 23.39 |
| 29 | 0.035 | 0.0015 |  | 6.82 | 8.19 | 9.55 | 10.91 | 12.28 | 13.64 |
| 30 |  | 0.002 |  | 9.09 | 10.91 | 12.73 | 14.55 | 16.37 | 18.19 |
| 31 |  | 0.0025 |  | 11.37 | 13.64 | 15.92 | 18.19 | 20.46 | 22.74 |
| 32 |  | 0.003 |  | 13.64 | 16.37 | 19.10 | 21.83 | 24.56 | 27.28 |
| 33 | 0.04 | 0.0015 |  | 7.80 | 9.35 | 10.91 | 12.47 | 14.03 | 15.59 |
| 34 |  | 0.002 |  | 10.39 | 12.47 | 14.55 | 16.63 | 18.71 | 20.79 |
| 35 |  | 0.0025 |  | 12.99 | 15.59 | 18.19 | 20.79 | 23.39 | 25.98 |
| 36 |  | 0.003 |  | 15.59 | 18.71 | 21.83 | 24.95 | 28.06 | 31.18 |

As describe above, the array 400 of piezoelectric modules $M_{ji,i}$ is defined through a square matrix where the number of sets i of piezoelectric modules $M_{ji,i}$, is the same as the number of piezoelectric elements $E_{ji,i}$ in each set i, then $j=j_1=j_2=\ldots=j_i$ of piezoelectric modules $M_{ji,i}$. Then, in this particular case: i=j.

Each piezoelectric module $M_{ji,i}$ is in turn provided with a AC/DC converter $C_{ji,i}$ that includes a standard LM7824 regulator. The LM7824 regulator gives an output DC voltage $V_{ji,i}$ of 24 V. The speed at which the triggering force F is applied on all the piezoelectric modules $M_{ji,i}$ is set by the activation plate 750 so that an output current $I_{ji,i}$ in each of the piezoelectric modules $M_{ji,i}$ is 1.5 A. Each piezoelectric module $M_{ji,i}$ thus gives an output DC voltage $V_{ji,i}$ of 24 V and an output current $I_{ji,i}$ of 1.5 A.

The square array 400 of electrically interconnected piezoelectric modules $M_{ji,i}$, can be then defined for the piezoelectric generator unit 650 in this example as follows. The output voltage $V_{out}$ in the piezoelectric generator unit 650 is the same in each set i of piezoelectric modules $M_{ji,i}$. Since each set i of piezoelectric modules $M_{ji,i}$, has j piezoelectric elements, then, the total voltage $V_{out-tot}$ and the total current $I_{out-tot}$ at the output of each set i of piezoelectric modules $M_{ji,i}$ is, respectively:

$$V_{out-tot}=V_{ji,i} \cdot j$$

$$I_{out-tot}=I_{ji,i} \cdot i$$

The theoretical electric power $P_{out-tot-T}$ is determined by multiplying the output voltage $V_{out-tot}$ in volts by the output current $I_{out-tot}$ in amps so that:

$$P_{out-tot-T}=V_{out-tot} \cdot I_{out-tot}$$

Then the total theoretical electric power $P_{out-tot-T}$ generated by the piezoelectric generator unit 650 is:

$$P_{out-tot-T}=V_{out-tot} \cdot I_{out-tot}=(V_{ji,i} \cdot j) \cdot (I_{ji,i} \cdot i)$$

Replacing with the above values:

$$P_{out-tot-T}=(24 \cdot j) \cdot (1.5 \cdot i)$$

$$26350=(24 \cdot j) \cdot (1.5 \cdot i)$$

As stated above, a square array 400 of piezoelectric modules $M_{ji,i}$ is used in the example shown which is defined by i sets of piezoelectric modules $M_{ji,i}$ each having j piezoelectric elements, that is, i=j, and thus:

$$26350=(24 \cdot j) \cdot (1.5 \cdot i)=(24 \cdot j) \cdot (1.5 \cdot j)=(24 \cdot 1.5) \cdot j^2$$

$$26350=36 \cdot j^2$$

From the above, the total number j of piezoelectric elements in the array 400 of piezoelectric modules $M_{ji,i}$ can be then determined as follows:

$$j=\sqrt{\frac{26350}{36}}=27.05 \approx 28$$

Therefore, in the present non-limiting example, i=j=28, so that piezoelectric generator unit 650 are required each having an array 400 of piezoelectric modules $M_{ji,i}$ including 28 sets i connected in parallel of piezoelectric modules $M_{ji,i}$ each having 28 piezoelectric modules $M_{ji,i}$ connected in series. This results in a total number of piezoelectric modules $M_{ji,i}$ of 28×28=784.

From the above defined array 400 of piezoelectric modules $M_{ji,i}$, total values of tension $V_{out-tot}$, current $I_{out-tot}$ and real power $P_{out-tot}$ can be determined:

$$V_{out-tot}=24 \times 28=672 \ V$$

$$I_{out-tot}=1.5 \times 28=42 \ A$$

$$P_{out-tot}=V_{out-tot} \times I_{out-tot}=672 \times 42=28.22 \ KW$$

Examples of the minimum piezoelectric generator units 650 needed to give unlimited autonomy to the top best selling electric vehicles so far are shown in the following Table 2.

TABLE 2

| Vehicle | Vehicle autonomy (km) | Battery Consumption time at 130 Km/h (hours) | Battery capacity (KWh) | Theoretical power supplied by the piezoelectric generator unit 650 $P_{out-tot-T}$ (KW) (charging efficiency 75%) | Piezoelectric modules ($M_{ji,i}$) connected in series (j) | Sets (i) of piezoelectric modules ($M_{ji,i}$) connected in parallel | Voltage supplied by the piezoelectric generator unit 650 $V_{out}$ (V) (charging efficiency 75%) | Current supplied by the piezoelectric generator unit 650 $I_{out}$ (A) (charging efficiency 75%) | Power supplied by the piezoelectric generator unit 650 $P_{out}$ (KW) (charging efficiency 75%) |
|---|---|---|---|---|---|---|---|---|---|
| 1 | 122 | 0.94 | 23 | 30.64 | 30 | 30 | 720 | 45 | 32.40 |
| 2 | 150 | 1.15 | 16 | 17.33 | 22 | 22 | 528 | 33 | 17.42 |
| 3 | 150 | 1.15 | 18.7 | 20.26 | 24 | 24 | 576 | 36 | 20.74 |
| 4 | 160 | 1.23 | 18.8 | 19.09 | 24 | 24 | 576 | 36 | 20.74 |
| 5 | 180 | 1.38 | 22 | 19.86 | 24 | 24 | 576 | 36 | 20.74 |
| 6 | 185 | 1.42 | 22 | 19.32 | 24 | 24 | 576 | 36 | 20.74 |
| 7 | 170 | 1.31 | 24 | 22.94 | 26 | 26 | 624 | 39 | 24.34 |
| 8 | 190 | 1.46 | 24.2 | 20.70 | 24 | 24 | 576 | 36 | 20.74 |
| 9 | 200 | 1.54 | 27 | 21.94 | 25 | 25 | 600 | 38 | 22.50 |
| 10 | 370 | 2.85 | 60 | 26.35 | 28 | 28 | 672 | 42 | 28.22 |
| 11 | 480 | 3.69 | 85 | 28.78 | 29 | 29 | 696 | 44 | 30.28 |

In the above Table 2, vehicle 1 is the Ford Focus Electric, vehicle 2 is the Mitsubishi i-Miev, vehicle 3 is the Volkswagen e-up!, vehicle 4 is the BMW i3, vehicle 5 is the Renault ZOE, vehicle 6 is the Renault Fluenze Z.E., vehicle 7 is the Nissan Leaf, vehicle 8 is the Volkswagen e-Golf, vehicle 9 is the Kia Soul EV, vehicle 10 is the Tesla Model S 60 and vehicle 11 is the Tesla Model S 85.

In the above sizing for the piezoelectric generator unit 650 in the present example, a normal gravity, i.e. 1G, has been considered. Depending on the weight of the electric vehicle 1000, a number of different piezoelectric generator units 650 can be suitably sized according to the mechanical dynamic loads or forces $F_1, F_2 \ldots F_n$ acting on the piezoelectric modules $M_{ji,i}$ to convert them into electric power.

The electric vehicle 1000 in the present example is a standard vehicle weighting m=2,175 kg empty, which corresponds to mg=2,175·9.81=21,337 N. This electric vehicle 1000 is fitted with the present piezoelectric generator system 100 having a number of piezoelectric generator units 650 each including 784 piezoelectric modules $M_{ji,i}$ a determined above. Each piezoelectric generator unit 650 is set to transmit a triggering force of 5 N which corresponds to a total of 3,920 N. The piezoelectric generator unit 650 are fitted in the suspension of the electric vehicle 1000, between the lower support of the spring and the spring itself in the suspension. For increasing the power-generation capacity, the piezoelectric generator units 650 are fitted near the four shock absorbers of the electric vehicle 1000. Other positions where dynamic loads or forces $F_1, F_2 \ldots F_n$ can be transformed into electric power are possible.

The dynamic loads or forces $F_1, F_2 \ldots F_n$ acting on and/or transmitted by the electric vehicle 1000, while travelling on the road 1100 or even when it is stopped, are thus distributed into a number of small triggering forces F acting at the same time on the same number of small piezoelectric elements $E_{ji,i}$. It is important to note that small triggering forces F are transformed into corresponding small AC voltages which, in turn, are converted by corresponding AC/DC converters $C_{ji,i}$ into DC voltages $V_{ji,i}$. Through the above described specific connection of arrays 400 of electrically interconnected piezoelectric modules $M_{ji,i}$, the electrical connection of the piezoelectric modules $M_{ji,i}$ in each set i in series allows output voltage $V_{out}$ to be increased while the electrical connection of the sets i of piezoelectric modules $M_{ji,i}$ in parallel allows output current $I_{out}$ to be increased thus obtaining high values of output electric power $P_{out}$.

In practice, however, the dynamic loads or forces $F_1, F_2 \ldots F_n$ are applied with values of gravity greater than the above mentioned 1G so that a lot more electric power can be generated. Standard vehicles are designed typically to withstand vibrations and accelerations of the order of from 5G to 10G. Thus, considering for example forces $F_1, F_2 \ldots F_n$ at 2G in the electric vehicle 1000, that is, at an acceleration of 19.62 m/s², total forces $F_1, F_2 \ldots F_n$ of the order of m·2G=2,175·19.62=42673.5 N are transmitted to the piezoelectric generator units 650 such that more electric power is generated for the electric vehicle 1000.

In the electric vehicle 1000 fitted with the present piezoelectric generator system 100 including a piezoelectric generator unit 650, no refuelling is required, that is, the electric vehicle does not need to stop for recharging or replacing the batteries 250. The batteries 250 are recharged as the electric vehicle 1000 is travelling and even as the electric vehicle 1000 is stopped due to the external forces $F_1, F_2 \ldots F_n$ received.

Although only a particular example of the present piezoelectric generator system has been disclosed herein, it will be understood by those skilled in the art that other alternative examples and/or uses and obvious modifications and equivalents thereof are possible.

For example, in the example herein described a piezoelectric generator system 100 has been installed in an electric vehicle 1000 for driving on a road 1100, i.e. a car, such that kinetic energy from dynamic loads or forces $F_1, F_2 \ldots F_n$ are efficiently transformed into electric power. However, it will be clear for those skilled in the art that the present piezoelectric generator system 100 can be also installed in other land vehicles such as motorcycles, trucks, trains, trams, locomotives as well as in marine and air vehicles such as aircrafts, ships, and machinery in general. The piezoelectric generator system 100 described herein can be also installed in Eolic and hydraulic plants for generating electric power.

Figure 9:
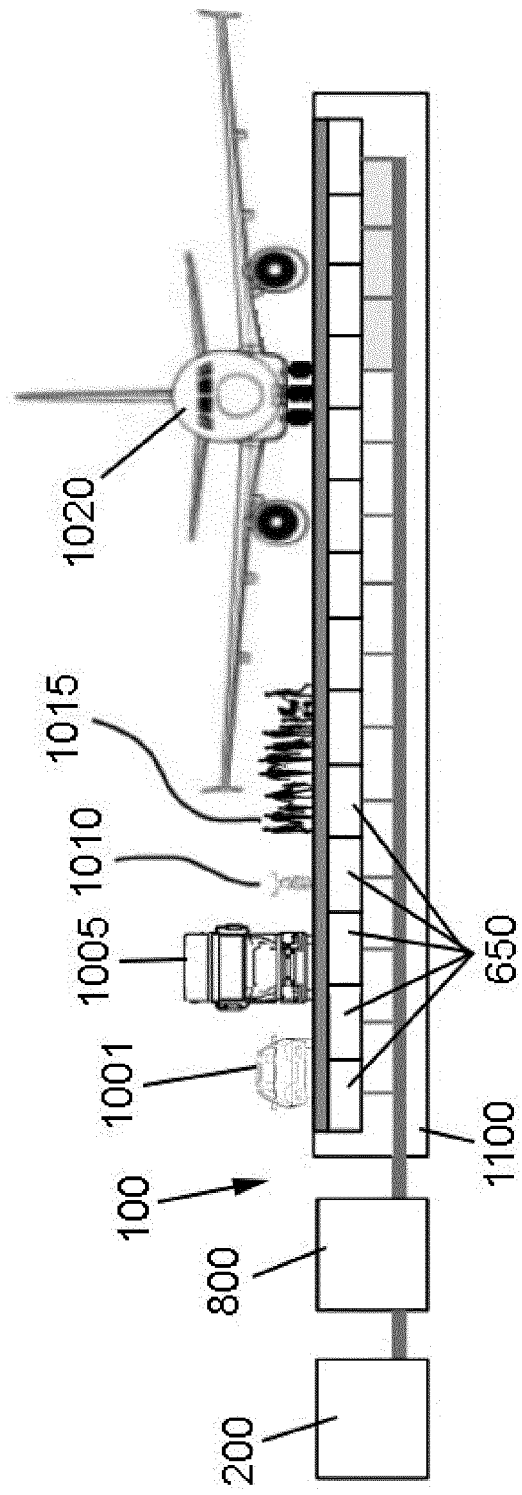
FIGS. 9 and 10 are synoptic drawings showing a further example of application of the present piezoelectric generator system.

In the synoptic drawing of FIG. 9, a further example of application of the present piezoelectric generator system 100 is shown. In this example of FIG. 9, the piezoelectric generator system 100 is installed below the ground 1100. In said synoptic drawing different grounds corresponding to transit roads, highways, runways, etc. have been indicated in common by reference numeral 1100 on which motor vehicles 1001, trucks 1005, motorcycles 1010, people 1015, such as for example pedestrians, and planes 1020 can travel or walk.

Figure 10:
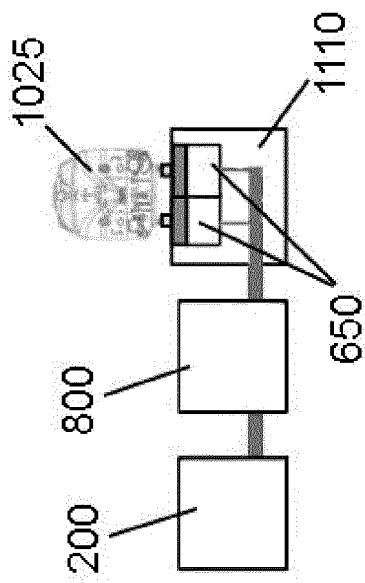

In the synoptic drawing of FIG. 10, a train 1025 has been illustrated standing on a railway 1110.

In both examples shown in the synoptic drawings of FIGS. 9 and 10, the piezoelectric generator system 100 is installed such that the piezoelectric generator units 650 are arranged below a surface such as the ground 1100 or the railway 1110 in FIGS. 9 and 10, respectively, and with corresponding electrical power storage and supply devices 200 and corresponding output control devices 800 connected thereto.

With the above configuration, the piezoelectric generator system 100 is capable of capturing dynamic forces $F_1, F_2 \ldots F_n$ from said motor vehicles 1001, trucks 1005, motorcycles 1010, people 1015, planes 1020 and trains 1025 travelling or walking on the ground 1100 or the railway 1110 and transforming them into electric power.

The following Table 3 includes examples of different configurations of piezoelectric generators 650 for a square array 400 of electrically interconnected piezoelectric modules $M_{ji,i}$ with piezoelectric elements $E_{ji,i}$ having the following features:

piezoelectric voltage constant: g33=0.04 Vm/N height: h=0.04 m diameter: D=0.003 m for a predetermined triggering force F for each piezoelectric module $M_{ji,i}$ of 2 N and a current value from each piezoelectric modules $M_{ji,i}$ of 1.5 A.

TABLE 3

| Generator | Piezoelectric modules $M_{ji,i}$ connected in series | Sets i of piezoelectric modules $M_{ji,i}$ connected in parallel | Total number of piezoelectric modules $M_{ji,i}$ | Voltage from each piezoelectric modules $V_{ji,i}$ (A) | $V_{out}$ (V) | $I_{out}$ (A) | $P_{out}$ (W) | Total force for active the piezoelectric generator (N) | Equivalent weight (Kg) |
|---|---|---|---|---|---|---|---|---|---|
| 1 | 2 | 2 | 4 | 56.59 | 113 | 3 | 340 | 8 | 0.82 |
| 2 | 3 | 3 | 9 | 56.59 | 170 | 5 | 764 | 18 | 1.83 |
| 3 | 4 | 4 | 16 | 56.59 | 226 | 6 | 1.358 | 32 | 3.26 |
| 4 | 5 | 5 | 25 | 56.59 | 283 | 8 | 2.122 | 50 | 5.10 |
| 5 | 10 | 10 | 100 | 56.59 | 566 | 15 | 8.488 | 200 | 20.39 |
| 6 | 15 | 15 | 225 | 56.59 | 849 | 23 | 19.099 | 450 | 45.87 |
| 7 | 25 | 25 | 625 | 56.59 | 1415 | 38 | 53.052 | 1.250 | 127 |
| 8 | 75 | 75 | 5.625 | 56.59 | 4244 | 113 | 477.464 | 11.250 | 1.147 |
| 9 | 100 | 100 | 10000 | 56.59 | 5659 | 150 | 848.824 | 20.000 | 2.039 |
| 10 | 125 | 125 | 15625 | 56.59 | 7074 | 188 | 1.326.288 | 31.250 | 3.186 |

The above Table 3 shows the high amount of power output that can be generated by the present piezoelectric generator system 100.

From the examples shown in the synoptic drawings of FIGS. 9 and 10 it is clear that one important advantage of the present piezoelectric generator system 100 is that it is capable of generating energy from small dynamic loads or forces $F_1, F_2 \ldots F_n$ as it can be installed in multiple locations. For example, as shown in table 3, one piezoelectric generator unit 650 comprising an array 400 of 2×2 piezoelectric modules $M_{ji,i}$ is capable of generating an amount of electric power of 340 W from a dynamic load of 0.82 Kg. In this example, considering that each piezoelectric element $E_{ji,i}$ is 3 mm in diameter, the dimensions of the piezoelectric generator unit 650 are advantageously reduced. A great number of piezoelectric generator units 650 can be installed, with each of which being capable of generating high electric power from small forces.

Further examples of locations where the present piezoelectric generator can be installed are riverbeds, seabed, coasts, slopes of mountains, facades in high buildings, and in general anywhere where a significant number of small forces $F_1, F_2 \ldots F_n$ can be collected.

Still a further example of application for the present piezoelectric generator system 100 corresponds to capturing dynamic loads $F_1, F_2 \ldots F_n$ generated from forces of the nature such as the water or the wind. In this case, the piezoelectric generator units 650 can be installed in hydroelectric or Eolic plants obtaining important advantages.

Yet an additional important advantage is that the present piezoelectric generator 100 is much more efficient in the transformation of mechanical energy into electric power such that with the same force much more power can be generated taking less space than current energy generation methods. Referring again to Table 3, using a piezoelectric generator 100 including a piezoelectric generator unit 650 having an array 400 of 125×125 piezoelectric modules $M_{ji,i}$, an amount of power of 1.3 MW can be generated from a dynamic load of 3186 Kg. Considering that each piezoelectric element $E_{ji,i}$ is 3 mm in diameter, the dimensions of the piezoelectric generator unit 650 are advantageously reduced. A great number of piezoelectric generator units 650 can be installed for example in a hydraulic plant generating a high amount electric power. This is very advantageous in particular taking into account that currently hydraulic generation plants are considered as generating high amount of electric power when the amount of electric power that is generated is of the order of more than 10 MW.

In all of the intended applications, the present piezoelectric generator system 100 can be installed to work efficiently without particular changes on the parts thereof, with only minimal changes being required, such as for example the configuration of the piezoelectric modules $M_{ji,i}$. In any case, the operating principle of the present piezoelectric generator system 100 always remains the same as described above.

Therefore, the present disclosure covers all possible combinations of the particular example that has been described herein such that the scope should not be limited by said particular example, but should be determined only by a fair reading of the claims that follow.

Reference signs related to drawings and placed in parentheses in a claim are solely for attempting to increase its intelligibility and shall not be construed as limiting its scope.

The invention claimed is:

1. A piezoelectric generator system comprising at least one piezoelectric generator unit, each generator unit comprising:

an array of piezoelectric modules $M_{ji,i}$, each of said piezoelectric modules $M_{ji,i}$ comprising a piezoelectric element $E_{ji,i}$ and an alternating current/direct current converter $C_{ji,i}$ for converting alternating current generated by the piezoelectric element $E_{ji,i}$ into direct current;

the array of piezoelectric modules $M_{ji,i}$ comprising a number of sets i of said piezoelectric modules $M_{ji,i}$, each of said sets i electrically connected to each other in parallel;

the sets i of piezoelectric modules $M_{ji,i}$ comprising a number $j_1, j_2, j_i$ of piezoelectric modules $M_{ji,i}$ electrically connected to each other in series;

the array being intended to supply electric power when said piezoelectric modules $M_{ji,i}$ are mechanically driven by at least one dynamic load such that an electrical voltage in each set i of piezoelectric modules $M_{ji,i}$ is substantially the same;

an input force control device for controlling said dynamic loads such that only a predetermined amount of force with a predetermined speed of application acts on the piezoelectric modules $M_{ji,i}$ such that a predetermined electric power is supplied by the piezoelectric generator unit; and said input force control device comprising an activation plate arranged to be moved only when the predetermined amount of force has been reached whereupon such force is evenly distributed and transmitted by the activation plate to all the piezoelectric elements of the piezoelectric modules $M_{ji,i}$ such that they all receive substantially the same predetermined force, substantially at the same moment, substantially for the same time, and substantially at the same predetermined speed; and a damping element suitable for damping the dynamic load or force so as to protect the piezoelectric modules $M_{ji,i}$.

2. The piezoelectric generator system according to claim 1, wherein it further comprises an electric power storage and supply device comprising at least one electric power storage and supply unit, at least one of said units being capable of working at least in a first, storage condition, capable of storing electric power, and in a second, supply condition, capable of delivering electric power.

3. The piezoelectric generator system according to claim 2, wherein it further comprises an output control device for receiving the electric power coming from all piezoelectric generators and supplying said electric power to said electric power storage and supply device.

4. The piezoelectric generator system according to claim 1, wherein the electric power is proportional to a height of the piezoelectric elements $E_{ji,i}$, an area of the piezoelectric elements $E_{ji,i}$, and a voltage constant of the piezoelectric elements $E_{ji,i}$ in each piezoelectric generator where the dynamic loads are acting.

5. The piezoelectric generator system according to claim 2, wherein it further comprises a charge status monitoring device for monitoring at least one of the charge status and the operating condition of at least one of the electric power storage and supply units.

6. The piezoelectric generator system according to claim 5, wherein it further comprises a switching device associated with the charge status monitoring device for switching between said storage and supply conditions of the power storage and supply unit depending on the charge status thereof.

7. The piezoelectric generator system according to claim 6, wherein the switching device is adapted for automatically switching between said storage and supply conditions of the power storage and supply units depending on the charge status thereof.

8. The piezoelectric generator system according to claim 1, wherein the damping element in the input force control device is at least one selected from a mechanical, pneumatic, hydraulic, and magnetic element.

9. The piezoelectric generator system according to claim 2, wherein the electric power storage and supply unit is capable of working at least in a third, standby condition, where no electric power is stored and no electric power is delivered.

10. The piezoelectric generator system according to claim 2, wherein the time taken by an electric power storage and supply unit for being fully charged is shorter than the time taken by an electric power storage and supply unit for being discharged when electric power is delivered.

11. The piezoelectric generator system according to claim 2, wherein the electric power storage and supply unit is a battery.

12. An electrical system including as, a power source, a piezoelectric generator system comprising at least one piezoelectric generator unit, each generator unit comprising:

an array of piezoelectric modules $M_{ji,i}$, each of said piezoelectric modules $M_{ji,i}$ comprising a piezoelectric element $E_{ji,i}$ and an alternating current/direct current converter $C_{ji,i}$ for converting alternating current generated by the piezoelectric element $E_{ji,i}$ into direct current;

the array of piezoelectric modules $M_{ji,i}$ comprising a number of sets i of said piezoelectric modules $M_{ji,i}$, each of said sets i electrically connected to each other in parallel;

the sets i of piezoelectric modules $M_{ji,i}$ comprising a number $j_1$, $j_2$, $j_i$ of piezoelectric modules $M_{ji,i}$ electrically connected to each other in series;

the array being intended to supply electric power when said piezoelectric modules $M_{ji,i}$ are mechanically driven by at least one dynamic load such that an electrical voltage in each set i of piezoelectric modules $M_{ji,i}$ is substantially the same;

an input force control device for controlling said dynamic loads such that only a predetermined amount of force with a predetermined speed of application acts on the piezoelectric modules $M_{ji,i}$ such that a predetermined electric power is supplied by the piezoelectric generator unit; and said input force control device comprising an activation plate arranged to be moved only when the predetermined amount of force has been reached whereupon such force is evenly distributed and transmitted by the activation plate to all the piezoelectric elements of the piezoelectric modules $M_{ji,i}$ such that they all receive substantially the same predetermined force, substantially at the same moment, substantially for the same time, and substantially at the same predetermined speed; and a damping element suitable for damping the dynamic load or force so as to protect the piezoelectric modules $M_{ji,i}$.

13. The electrical system according to claim 12, wherein the piezoelectric elements $E_{ji,i}$ of the piezoelectric generator system are driven by at least one dynamic load generated from at least one moving part of at least one of an electric vehicle and electric machine.

14. The electrical system according to claim 13, wherein the piezoelectric generator system is adapted to be mounted at a location of an electric vehicle selected from at least one of: a bottom of a shock absorber where it is connected to vehicle steering, between a shock absorber spring and a shock absorber spring lower support, between shock absorbers and suspensions, between the motor and a motor locking system, between suspensions and a vehicle body, between a vehicle frame front axle and a vehicle body, between a vehicle frame rear axle and a vehicle body, and under seats of a vehicle.

15. The electrical system according to claim 12, wherein the piezoelectric generator system is driven by at least one dynamic load generated from forces of the nature such as the water or the wind.

16. The electrical system according to claim 12, wherein the piezoelectric generator system is driven by at least one dynamic load generated from any vehicle, people or animals moving on a ground surface.

* * * * *